(12) United States Patent
Min et al.

(10) Patent No.: US 12,382,823 B2
(45) Date of Patent: *Aug. 5, 2025

(54) SEMICONDUCTOR NANOCRYSTAL PARTICLE AND PRODUCTION METHODS THEREOF

(71) Applicants: SAMSUNG ELECTRONICS CO., LTD., Suwon-si (KR); The Governing Council of the University of Toronto, Toronto (CA)

(72) Inventors: Jihyun Min, Seoul (KR); Eun Joo Jang, Suwon-si (KR); Edward H. Sargent, Toronto (CA); Hyo Sook Jang, Suwon-si (KR); Makhsud I. Saidaminov, Toronto (CA); Sjoerd Hoogland, Toronto (CA); Ankit Jain, Bombay (IN); Andrew Johnston, Whitby (CA); Oleksandr Voznyy, Thornhill (CA)

(73) Assignees: SAMSUNG ELECTRONICS CO., LTD., Gyeonggi-Do (KR); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 631 days.

This patent is subject to a terminal disclaimer.

(21) Appl. No.: 17/727,940

(22) Filed: Apr. 25, 2022

(65) Prior Publication Data

US 2022/0246876 A1    Aug. 4, 2022

Related U.S. Application Data

(63) Continuation-in-part of application No. 16/986,384, filed on Aug. 6, 2020, now Pat. No. 11,312,904.
(Continued)

(30) Foreign Application Priority Data

Aug. 3, 2020 (KR) .................. 10-2020-0096638

(51) Int. Cl.
H10K 85/30 (2023.01)
B82Y 20/00 (2011.01)
(Continued)

(52) U.S. Cl.
CPC .......... *H10K 85/30* (2023.02); *C09K 11/7435* (2013.01); *C09K 11/756* (2013.01);
(Continued)

(58) Field of Classification Search
CPC .............. C09K 11/757; C09K 11/7435; H10K 50/115; H10K 85/50
See application file for complete search history.

(56) References Cited

U.S. PATENT DOCUMENTS 10,273,405 B2   4/2019   Weidman et al.
10,329,484 B2   6/2019   Kovalenko et al.
(Continued)

FOREIGN PATENT DOCUMENTS

JP   2017110039 A   6/2017
KR   20170049452 A   5/2017
KR   20170078553 A   7/2017

OTHER PUBLICATIONS

Andrew Barnabas Wong et al. "Strongly Quantum Confined Colloidal Cesium Tin Iodide Perovskite Nanoplates: Lessons for Reducing Defect Density and Improving Stability," Nano letters, Mar. 5, 2018, pp. 2060-2066, vol. 8.
(Continued)

*Primary Examiner* — C Melissa Koslow
(74) *Attorney, Agent, or Firm* — CANTOR COLBURN LLP

(57) ABSTRACT

A semiconductor nanocrystal particle represented by Chemical Formula 1 and having a full width at half maximum (FWHM) of less than or equal to about 30 nanometers (nm) in the emission wavelength spectrum is provided:

$$A_x A'_{(3+\alpha-x)} D_{(2+\beta)} E_{(9+\gamma)}.$$ Chemical Formula 1

In Chemical Formula 1, A is a first metal including Rb, Cs, or a combination thereof, A' is an organic substance derived from an ammonium salt, an organic material derived from an organic ligand, or an organic material including a combination thereof, D is a second metal including Sb, Bi, or a combination thereof E is Cl, Br, I, or a combination thereof, $1 < x \leq 3$, $-1 < \alpha < 1$, $3+\alpha-x > 0$, $-1 < \beta < 1$, and $-1 < \gamma < 1$.

19 Claims, 10 Drawing Sheets

Related U.S. Application Data

(60) Provisional application No. 62/883,304, filed on Aug. 6, 2019.

(51) Int. Cl.
  *B82Y 40/00* (2011.01)
  *C09K 11/74* (2006.01)
  *C09K 11/75* (2006.01)
  *H10K 50/115* (2023.01)
  *H10K 85/50* (2023.01)

(52) U.S. Cl.
  CPC ......... *H10K 50/115* (2023.02); *H10K 85/381* (2023.02); *H10K 85/50* (2023.02); *B82Y 20/00* (2013.01); *B82Y 40/00* (2013.01)

(56) References Cited

U.S. PATENT DOCUMENTS

| 10,585,228 | B2 | 3/2020 | Kim et al. |
| 10,597,580 | B2 | 3/2020 | Min et al. |
| 11,312,904 | B2* | 4/2022 | Min .................... C09K 11/025 |
| 2017/0084848 | A1 | 3/2017 | Gao et al. |
| 2018/0355244 | A1 | 12/2018 | Lüchinger et al. |
| 2020/0190401 | A1 | 6/2020 | Min et al. |
| 2020/0192016 | A1 | 6/2020 | Kim et al. |

OTHER PUBLICATIONS

Jaya Pal et al., "Colloidal Synthesis and Photophysics of M3Sb2I9 (M=Cs and Rb) Nanocrystals: Lead-Free Perovskites," Angewandte Chemie, Oct. 9, 2017, pp. 14375-14379, vol. 129.

Jian Zhang et al., "High Quantum Yield Blue Emission from Lead-Free Inorganic Antimony Halide Perovskite Colloidal Quantum Dots," ACS Nano, Sep. 7, 2017, pp. 9294-9302, vol. 11.

Linyuan Lian et al., "Colloidal synthesis of lead-free all-inorganic cesium bismuth bromide perovskite nanoplatelets," CrystEngComm, Oct. 8, 2018, pp. 7473-7478, vol. 20.

Meiying Leng et al., "Lead-Free, Blue Emitting Bismuth Halide Perovskite Quantum Dots," Angew. Chem. Int. Ed., Oct. 28, 2016, pp. 15012-15016, vol. 55.

Yongbing Lou et al., "Formation of highly luminescent cesium bismuth halide perovskite quantum dots tuned by anion exchange," ChemComm, Mar. 19, 2018, pp. 3779-3782, vol. 54.

Zhaoyang Qi et al., "Highly stable lead-free Cs3Bi2I9 perovskite nanoplates for photodetection applications," Nono Research, 2019, pp. 1-6.

Jaya Pal et al., "Colloidal Synthesis and Photophysics of M3Sb2I9 (M=Cs and Rb) Nanocrystals: Lead-Free Perovskites," Angew. Chem. Int. Ed., Oct. 9, 2017, pp. 14187-14191, vol. 56.

* cited by examiner

SEMICONDUCTOR NANOCRYSTAL PARTICLE AND PRODUCTION METHODS THEREOF

CROSS-REFERENCE TO RELATED APPLICATION

This application is a continuation-in-part of U.S. application Ser. No. 16/986,384, filed on Aug. 6, 2020, now U.S. Pat. No. 11,312,904, which claims priority to and the benefit of U.S. provisional Application No. 62/883,304 filed Aug. 6, 2019 and Korean Patent Application No. 10-2020-0096638 filed in the Korean Intellectual Property Office on Aug. 3, 2020 and all the benefits accruing therefrom under 35 U.S.C. § 119, the contents of which in their entirety are herein incorporated by reference.

BACKGROUND

1. Field

A semiconductor nanocrystal particle and a production method thereof are related.

2. Description of the Related Art

Unlike bulk materials, in the case of the nanoparticles, some physical characteristics (e.g., bandgap energies and melting points), which are intrinsic for the bulk materials, may be controlled by changing a particle size of the nanoparticles. For example, a semiconductor nanocrystal particle also known as a quantum dot is a crystalline material having a size of several nanometers. Such a semiconductor nanocrystal particle has a relatively small size, has a large surface area per unit volume, and exhibits a quantum confinement effect, showing properties different from those of a bulk material having the same composition. The quantum dot may absorb light from an excitation source to be excited and may emit energy corresponding to a bandgap energy of the quantum dot.

Quantum dots capable of exhibiting improved photoluminescence properties may include heavy metals such as cadmium and lead. From an environmental perspective, it is desirable to develop environmentally-friendly quantum dots that do not include heavy metals such as cadmium, lead, or a combination thereof.

SUMMARY

An environmentally-friendly semiconductor nanocrystal particle having a high color purity, for example, a narrow full width at half maximum (FWHM), and a production method thereof is provided.

According to an embodiment, a semiconductor nanocrystal particle (nanoparticle) represented by Chemical Formula 1 and having a full width at half maximum (FWHM) of an emission wavelength spectrum of less than or equal to about 30 nanometers (nm) is provided:

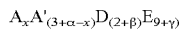  Chemical Formula 1

$$A_xA'_{(3+\alpha-x)}D_{(2+\beta)}E_{9+\gamma}$$

In Chemical Formula 1,

A is a first metal including Rb, Cs, or a combination thereof,

A' is an organic material derived from an ammonium salt, an organic material derived from an organic ligand, or an organic material including a combination thereof, D is a second metal including Sb, Bi, or a combination thereof, E is Cl, Br, I, or a combination thereof, $1<x\leq3$, $-1<\alpha<1$, $3+\alpha-x>0$, $-1<\beta<1$, and $-1<\gamma<1$.

The first metal may further include Na, K, or a combination thereof.

The second metal may further include Cu, Sn, In, Ga, Zn, Ag, Au, Pd, or a combination thereof.

The semiconductor nanocrystal particle may have a full width at half maximum (FWHM) of a maximum emission peak of less than or equal to about 25 nm.

The semiconductor nanocrystal particle may have a maximum emission peak between about 440 nm and about 560 nm.

The maximum emission peak may be between about 440 nm to about 490 nm, or about 500 nm to about 560 nm.

The organic material derived from the ammonium salt may be $NR^1_4{}^+$, wherein $R^1$ is independently hydrogen, a hydroxyl group, a substituted or unsubstituted C1 to C24 linear or branched alkyl group, or a substituted or unsubstituted C7 to C30 arylalkyl group, $[CH(NH_2)_2]^+$, or a combination thereof.

The organic material derived from the ammonium salt may include formamidinium (FA), butylammonium (BA), diisopropylammonium, methylammonium (MA), hydroxylammonium (HA), phenylethylammonium (PEA), or a combination thereof.

The semiconductor nanocrystal particle may include a perovskite crystal structure.

The semiconductor nanocrystal particle may have a shape of a nanoplatelet.

The semiconductor nanocrystal particle may emit green light having a maximum emission peak between about 500 nm and about 560 nm and the green light may have a color coordinate Cx value of less than about 0.2 and a Cy value of greater than about 0.6.

A molar amount of D of Chemical Formula 1, measured by an area of an X-ray photoelectron analysis spectrum on a surface of the semiconductor nanocrystal particle, may be greater than a molar amount of each of the A, A', and E of Chemical Formula 1, measured by the area of the X-ray photoelectron analysis spectrum on the surface of the semiconductor nanocrystal particle.

A mole ratio of A to A' of Chemical Formula 1, measured by an area ratio of the X-ray photoelectron analysis spectrum on the surface of the semiconductor nanocrystal particle, may be about 1:1 to about 4:1.

A method of producing semiconductor nanocrystal particle according to another embodiment includes providing an antisolvent including an organic ligand, injecting a first metal precursor, a second metal precursor, and an organic material precursor into the antisolvent including the organic ligand to form a mixture, and heating the mixture at a temperature of less than about 70° C. to produce the semiconductor nanocrystal particle.

The organic ligand may include $R^2COOH$, $R^2NH_2$, $R^2{}_2NH$, $R^2{}_3N$, $R^2SH$, $R^2{}_3PO$, $R^2{}_3P$, $R^2OH$, $R^2COOR^3$, $R^2PO(OH)_2$, $R^2{}_2POOH$, and $R^2COOCOR^3$ (wherein, $R^2$ and $R^3$ are independently a substituted or unsubstituted C1 to C24 aliphatic hydrocarbon group, or a substituted or unsubstituted C5 to C24 aromatic hydrocarbon group), or a combination thereof.

The organic ligand may include oleic acid, oleylamine, or a combination thereof.

The antisolvent may include a nitrogen-containing heterocyclic compound, a C6 or greater aromatic hydrocarbon group, an aromatic ether, or a combination thereof.

The first metal precursor may include a powder of the first metal, an alkylated compound of the first metal, an alkoxide of the first metal, a carboxylate of the first metal, a nitrate of the first metal, a perchlorate of the first metal, a sulfate of the first metal, an acetylacetonate of the first metal, a halide of the first metal, a cyanide of the first metal, a hydroxide of the first metal, an oxides of the first metal, a peroxide of the first metal, or a combination thereof.

The second metal precursor may include a powder of the second metal, an alkylated compound of the second metal, an alkoxide of the second metal, a carboxylate of the second metal, a nitrate of the second metal, a perchlorate of the second metal, a sulfate of the second metal, an acetylacetonate of the second metal, a halide of the second metal, a cyanide of the second metal, a hydroxide of the second metal, an oxide of the second metal, a peroxide of the second metal, or a combination thereof.

The organic material precursor may include an ammonium salt.

An environmentally friendly semiconductor nanocrystal particle having a high color purity, for example, a narrow full width at half maximum (FWHM), and a method for producing the same is provided. The produced environmentally-friendly semiconductor nanocrystal particles may be applied to, e.g., used in, various display devices and biological labeling (biosensors, bio-imaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
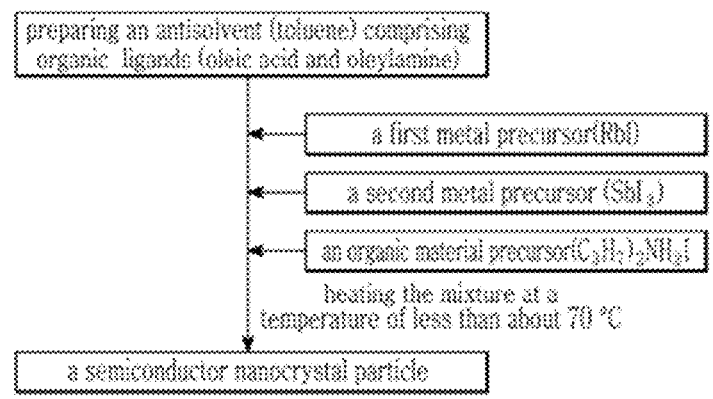
FIG. 1 is a flowchart of a method for producing semiconductor nanocrystal particle according to an embodiment.
Figure 2A:
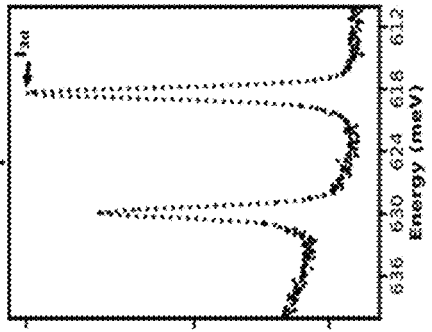
FIG. 2A is a graph of normalized counts (arbitrary units (A.U.)) versus energy (millielectronvolts (meV)) showing X-ray Diffraction (XRD) analysis results of the nanoplatelet of Example 1.
Figure 2B:
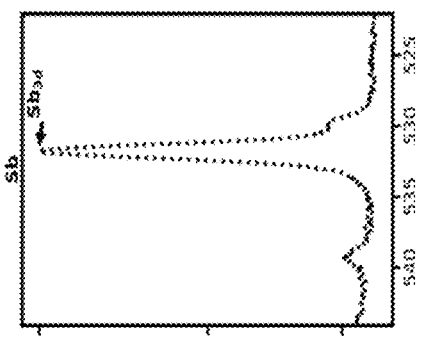
FIG. 2B is a graph of normalized counts (A.U.) versus energy (meV) showing XRD analysis results of the nanoplatelet of Example 1.
Figure 2C:
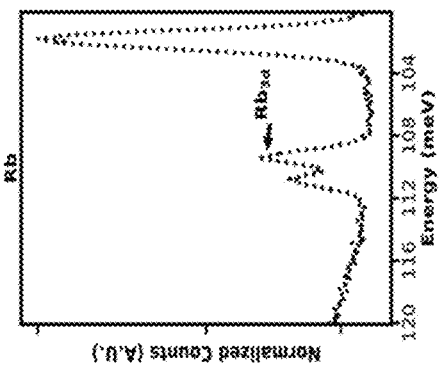
FIG. 2C is a graph of normalized counts (A.U.) versus energy (meV) showing XRD analysis results of the nanoplatelet of Example 1.
Figure 2D:
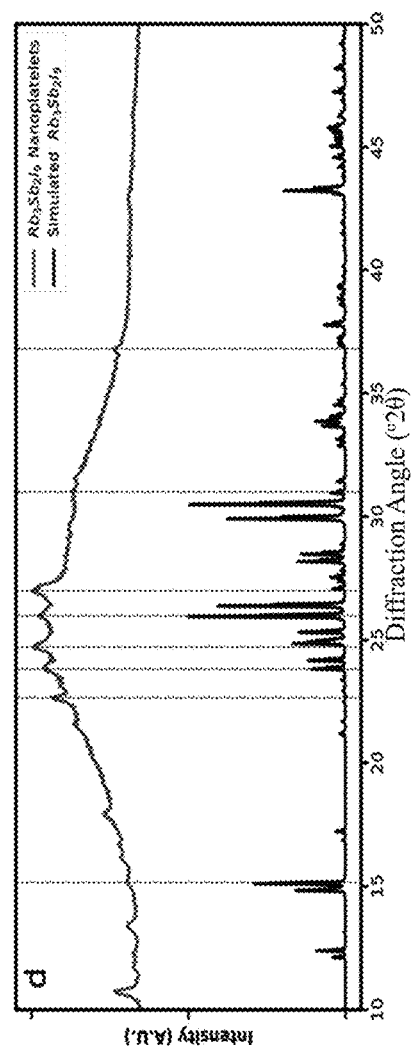
FIG. 2D is a graph of intensity (A.U.) versus diffraction angle (°2θ) using Cu Kα radiation showing XRD analysis results of the nanoplatelet of Example 1 and the $Rb_3Sb_2I_9$ perovskite simulation results.

Advantages and characteristics of this disclosure, and a method for achieving the same, will become evident referring to the following embodiments together with the drawings attached hereto. However, the embodiments should not be construed as being limited to the embodiments set forth herein.

If not defined otherwise, all terms (including technical and scientific terms) in the specification may be defined as commonly understood by one skilled in the art. The terms defined in a generally-used dictionary may not be interpreted ideally or exaggeratedly unless clearly defined.

In addition, unless explicitly described to the contrary, the word "comprise", and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen, or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group, or a C6 to C12 aryl group), a carboxyl group (—OOOH), or a salt thereof (—C(=O)OM, wherein M is an organic or inorganic cation), a sulfonic acid group (—S$_3$H), or a salt thereof (—SO$_3$M, wherein M is an organic or inorganic cation), a phosphoric acid group (—P$_3$H$_2$), or a salt thereof (—PO$_3$MH, or —PO$_3$M$_2$, wherein M is an organic or inorganic cation), and a combination thereof.

As used herein, "arylalkyl group" refers to an alkyl group substituted with an aryl group. For example, in the phenylethyl group, one end of the ethyl group is substituted with a phenyl group, and the other end thereof is linked to a substituent.

In addition, "aliphatic hydrocarbon group" refers to a C1 to C30 linear or branched alkyl group, and "aromatic hydrocarbon group" refers to a C6 to C30 aryl group or a C2 to C30 heteroaryl group.

As used herein, "visible light" refers to light having a wavelength of about 390 nm to about 700 nm.

As used herein, quantum yield (QY) or quantum efficiency (QE) is a value determined from a photoluminescence spectrum obtained by quantum dots dispersed in an organic solvent (e.g., toluene), and an organic solution of a reference dye (e.g., coumarin dye) and may be calculated for the photoluminescent peak of the ethanol solution (absorption (optical density) at 458 nm is 0.1)). In this specification, quantum yield and quantum efficiency have the same meaning and are used as interchangeable terms.

As used herein, "Group" refers to a group of Periodic Table.

As used herein, "Group III" refers to Group IIIA and Group IIIB, and examples of Group III metal may be Al, In, Ga, and Tl, but are not limited thereto.

As used herein, "Group V" refers to Group VA, and examples may include N, P, As, Sb, and Bi, but are not limited thereto.

As used herein, "size" refers to a size of a particle or an average size of particles. As used herein, "area" refers to an area of a planar directional surface of a particle or an average area of planar directional surfaces of particles.

A perovskite structure or perovskite crystal structure, as used herein, refers to a structure that is isostructural with perovskite, i.e., CaTiO$_3$.

Semiconductor nanocrystal particles are crystalline materials having a size of several nanometers. Such semiconductor nanocrystals particles may have a large surface area per a unit volume due to very small sizes and may exhibit different characteristics from bulk materials having the same composition due to a quantum confinement effect. The semiconductor nanocrystal particles may absorb light from an excitation source to be excited, and may emit energy corresponding to a bandgap energy of the semiconductor nanocrystal particles.

The semiconductor nanocrystal particles have potential applicability to, e.g., in, various electronic devices due to unique photoluminescence characteristics. A core-shell quantum dot in which a semiconductor nanocrystal shell is formed on a three-dimensional core including semiconductor nanocrystal particles may improve photoluminescence properties. A cadmium-based or a lead-based quantum dot may exhibit improved properties. However, cadmium and lead may cause environmental and health issues and is a regulated element. Cadmium-free or lead-free semiconductor nanocrystal particles may be Group III-V based nanocrystals. Cadmium-free/lead-free semiconductor nanocrystal particles may have unfavorable photoluminescence properties (e.g., full width at half maximum (FWHM)) and stability compared with cadmium- or lead-based material.

In addition to core-shell quantum dots, a semiconductor nanocrystal particle may have a shape of a nanoparticle, a nanorod, and a multipod. In spherical particles, a charge carrier may be limited to a three-dimension, but the nanoparticles may be, e.g., have, a one-dimensional exciton confinement, and nanoparticles may exhibit different photoluminescence properties from core-shell quantum dots. However, visible light emitting (e.g., light of greater than or equal to 440 nm) nanoparticles may be based on semiconductor nanocrystals including cadmium, lead, or a combination thereof.

Semiconductor nanocrystal particles to replace cadmium, lead, or a combination thereof, may include metal halide perovskites. Perovskite semiconductor nanocrystal particles may exhibit emission spectrum controlling properties and relatively excellent quantum yield. Replacing cadmium, lead, or a combination thereof with metal halide perovskites, and divalent metals such as Sn, Ge, Ca, etc., may result in decreased performance and stability compared with semiconducting nanocrystal particles including conventional cadmium, lead, or a combination thereof.

Lead may be substituted with an atom having a different oxidation state sharing an ns2 hybrid state of Pb, for example, Sb, Bi, or a combination thereof. But when using a trivalent metal such as Sb, Bi, and the like, the stoichiometric ratio is different than divalent metals in order to maintain a charge balance of a perovskite structure. When using the trivalent metal, the perovskite is represented by A$_3$D$_2$E$_9$ (wherein, a monovalent metal may be in the A position, halogen may be in the E position, and the trivalent metal may be in the D position).

Perovskite represented by $A_3D_2E_9$ may exhibit a quantum yield of about 1% to about 40%, and the quantum yield may be sensitive to the synthesis condition, e.g., condition(s) used in the synthesis of perovskite represented by $A_3D_2E_9$.

$A_3D_2E_9$ perovskite may form two phases which are known as a dimmer structure (indirect bandgap) having a face-sharing octahedron or a layered structure (direct bandgap) having a corner-sharing octahedron. Forming a dimmer phase (indirect bandgap) of $Cs_3Sb_2I_9$ may be preferred compared to the layered structure, but the layer phase may be preferred when adding Cl (a relatively small halogen atom may increase the possibility to form a layer phase which is a direct bandgap). The layer phase may also be preferred when a nanocrystal includes Br and Cl.

When introducing a smaller cation such as Rb instead of Cs, in a nanocrystal including Br, I, or a combination thereof, the layered phase may be preferred compared to the dimmer phase to express a longer emission wavelength.

$A_3D_2E_9$ perovskite may exhibit a wider (for example, about 2 times) emission line width (e.g., full width at half maximum (FWHM)) than lead-halogen perovskite. Semiconductor nanocrystal particles may have a shape of quantum dots, and the size distribution of the semiconductor nanocrystal particles may cause an energy level distribution, e.g., varying energy levels, through the quantum dot group. But the energy level distribution, e.g., varying energy levels, may deteriorate a color purity by non-uniformly enlarging the emission line width.

The emission line width of $M_3Sb_2I_9$ (M=Cs, Rb) formed using a hot-injection method when synthesizing $A_3D_2E_9$ perovskite may have a width of greater than or equal to about 34 nm, and an implementable maximum emission peak of greater than or equal to about 570 nm, also.

$Cs_3Bi_2Br_9$ perovskite synthesized using the same method may exhibit an emission spectrum having a maximum emission peak of about 430 nm, but the emission line width may be greater than or equal to about 39 nm.

In a hot-injection method, the precursor including a trivalent metal (Sb, Bi) may be unstable at a relatively high temperature (e.g., greater than or equal to about 70° C., for example, greater than or equal to about 100° C.), and a considerable amount of precursors may be volatilized and disappear or oxidized and not participate in the reaction. Accordingly, a size distribution of $A_3D_2E_9$ perovskite prepared by employing a hot-injection method may be significantly increased, and a color purity of the final product (expressed by emission line width) may be deteriorated. In addition, an implementable color coverage (in visible light) by emitting light having a maximum emission peak of wavelength region of greater than about 560 nm may be decreased.

Provided is perovskite including no cadmium, lead, or a combination thereof and having a narrow emission line width (e.g., less than or equal to 30 nm), and the perovskite may have a maximum emission peak in a region from about 440 nm to about 560 nm and also have an emission line width of less than or equal to about 30 nm, for example, less than or equal to about 25 nm, or less than or equal to about 21 nm, which are narrow photoluminescence property, by controlling a content ratio of each precursor to provide the stoichiometric ratio with A:D:E=3:2:9 and using an antisolvent method instead of a hot-injection method.

The semiconductor nanocrystal particles according to an embodiment are based on semiconductor nanocrystal particles that are cadmium-free, lead-free, or a combination thereof.

In an embodiment, the semiconductor nanocrystal particles may be represented by Chemical Formula 1:

$$A_xA'_{(3+\alpha-x)}D_{(2+\beta)}E_{9+\gamma}$$ <span style="float:right">Chemical Formula 1</span>

In Chemical Formula 1, A is a first metal including Rb, Cs, or a combination thereof, A' is an organic material derived from an ammonium salt, an organic material derived from an organic ligand, or an organic material including a combination thereof, D is a second metal including Sb, Bi, or a combination thereof, E is Cl, Br, I, or a combination thereof, $1<x3$, $-1<\alpha<1$, $3+\alpha-x>0$, $-1<\beta<1$, and $-1<\gamma<1$.

The semiconductor nanocrystal particles are represented by Chemical Formula 1, basically a chemical formula belonging to an $A_3D_2E_9$ system. Accordingly, the semiconductor nanocrystal particles may include a perovskite crystal structure.

In an embodiment, the monovalent metal that may be in the A position may be a first metal including Rb, Cs, or a combination thereof, as described above. When Rb and Cs are in the A position together, a mole ratio of Rb to Cs is not particularly limited as long as the aforementioned range of x is satisfied. The first metal may further include Na, K, or a combination thereof.

In an embodiment, the A' position is a position included in the "A position" of perovskite represented by $A_3D_2E_9$. In an embodiment, the A' position may be classified and referred to as the A position and A' position for separating the monovalent metal from an organic material, but in an embodiment, both the A position and A' position may correspond to the "A position" of perovskite.

That is, in the semiconductor nanocrystal particles according to an embodiment, both the monovalent metal and the organic material described above may be present in the "A position."

The stoichiometric relationship between the monovalent metal and the organic material may be variously adjusted within a range that allows the content of the "A position" to satisfy $3+\alpha$ in total.

In an embodiment, among the organic materials of the A' position, examples of the organic material derived from an ammonium salt may be $NR^1_4{}^+$ (wherein $R^1$ is independently hydrogen, a hydroxyl group, a substituted or unsubstituted C1 to C24 linear or branched alkyl group, or a substituted or unsubstituted C7 to C30 arylalkyl group), $[CH(NH_2)_2]^+$ (formamidinium), or a combination thereof. The counterion may be any suitable negative species, preferably an inorganic species such as a halide.

For example, examples of the organic material derived from the ammonium salt may include formamidinium (FA), butylammonium (BA), diisopropylammonium, methylammonium (MA), hydroxylammonium (HA), phenylethylammonium (PEA), or a combination thereof.

In an embodiment, among the organic materials of the A' position, the organic material derived from the organic ligand may be, for example, an organic material derived from an organic ligand including $R^2COOH$, $R^2NH_2$, $R^2{}_2NH$, $R^2{}_3N$, $R^2SH$, $R^2{}_3PO$, $R^2{}_3P$, $R^2OH$, $R^2COOR^3$, $R^2PO(OH)_2$, $R^2{}_2POOH$, and $R^2COOCOR^3$ (wherein $R^2$ and $R^3$ are independently a substituted or unsubstituted C1 to C24 aliphatic hydrocarbon group or a substituted or unsubstituted C5 to C24 aromatic hydrocarbon group), or a combination thereof.

Specific examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, oleylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, and the like; a phosphine compound, or an oxide compound thereof such as methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, or trioctylphosphine oxide; diphenyl phosphine, a triphenyl phosphine compound, or an oxide compound thereof; a C5 to C20 alkyl phosphinic acid or a C5 to C20 alkyl phosphonic acid such as hexylphosphinic acid, octylphosphinic acid, dodecanphosphinic acid, tetradecanephosphinic acid, hexadecanephosphinic acid, octadecanephosphinic acid; and the like.

For example, the organic material derived from the organic ligand may be derived from an organic ligand including oleic acid, oleylamine, or a combination thereof.

When the organic material derived from an ammonium salt and the organic ligand derived from the organic ligand are in the A' position together, a mole ratio between the two organic materials is not particularly limited as long as the aforementioned range of 3+α−x is satisfied.

In an embodiment, the metal that of the D position may include a monovalent metal, a divalent metal, a trivalent metal, or a combination thereof, and may be a second metal including Sb, Bi, or a combination thereof, as described above. In addition, the second metal may further include Cu, Sn, In, Ga, Zn, Ag, Au, Pd, or a combination thereof. For example, the D position may include a trivalent metal, and additionally a monovalent metal, a divalent metal, or a combination thereof. In this case, a mole ratio between the respective metals is not particularly limited as long as the aforementioned range of 2+β is satisfied.

In an embodiment, the halogen in the E position may include Cr, Br, I, or a combination thereof, and for example, two or more halogen elements may be present together in the E position.

In an embodiment, types of the emission wavelength of the semiconductor nanocrystal particles may be variously controlled by adjusting types of halogen of the E position, internal mole ratios of the halogen(s) of the E position, and the like.

In an embodiment, the maximum emission peak of the emission wavelength spectrum that the semiconductor nanocrystal particles emits may belong to a visible wavelength region. That is, the semiconductor nanocrystal particles may emit light in the visible wavelength region.

The semiconductor nanocrystal particles according to an embodiment may have a maximum emission peak in a wavelength of greater than or equal to about 440 nm, for example, 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 485 nm, greater than or equal to about 490 nm, greater than or equal to about 495 nm, or greater than or equal to about 500 nm.

The semiconductor nanocrystal particles according to an embodiment may have a maximum emission peak in a wavelength of less than or equal to about 560 nm, for example, less than or equal to about 555 nm, less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm.

For example, the semiconductor nanocrystal particles may have a maximum emission peak between about 440 nm to about 560 nm, about 445 nm to about 560 nm, about 450 nm to about 560 nm, about 450 nm to about 555 nm, or about 450 nm to about 550 nm.

For example, the emission wavelength spectrum may have a first maximum emission peak between about 440 nm to about 490 nm. That is, the semiconductor nanocrystal particles may emit blue light having a first maximum emission peak.

Alternatively, the emission wavelength spectrum may have a second maximum emission peak between about 500 nm and about 560 nm. That is, the semiconductor nanocrystal particles may emit green light having a second maximum emission peak between about 500 nm and about 560 nm.

In an embodiment, the semiconductor nanocrystal particles may exhibit an improved full width at half maximum (FWHM) of the emission wavelength spectrum. For example, the semiconductor nanocrystal particles may have a full width at half maximum (FWHM) of less than or equal to about 30 nm, for example, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, or less than or equal to about 21 nm.

In an embodiment, the semiconductor nanocrystal particles may emit green light having a maximum emission peak of about 500 nm to about 560 nm and a full width at half maximum (FWHM) of an emission wavelength spectrum of less than or equal to about 30 nm. In this case, the green light may have a Cx value of less than about 0.2, for example, less than or equal to about 1.9, for example, less than or equal to about 1.8, and a Cy value of greater than about 0.6, for example, greater than or equal to about 0.61, or greater than or equal to about 0.62, among color coordinate values that may be defined in the CIE1931 color space.

The semiconductor nanocrystal particles may have a quantum efficiency of greater than or equal to about 10%, for example, greater than or equal to about 11%, greater than or equal to about 15%, greater than or equal to about 20%, greater than or equal to about 25%, or greater than or equal to about 30%.

In an embodiment, a surface of the semiconductor nanocrystal particles may include a material of the D position in a greater amount than the stoichiometric amount for forming perovskite crystal. In other words, the semiconductor nanocrystal particles may have a surface including a rich material of the D position.

A molar amount of the material of the D position of Chemical Formula 1, which is measured by an area of an X-ray photoelectron analysis spectrum on the surface of the semiconductor nanocrystal particle, may be higher than a molar amount of each of the A position, A' position, and E position.

In an embodiment, on the surface of the semiconductor nanocrystal particle, a content of the material of the A position of Chemical Formula 1 measured by an area of the X-ray photoelectron analysis spectrum may be higher than the material content in A' position. For example, on the surface of the semiconductor nanocrystal particle, a mole ratio of material of the A position to the A' position in Chemical Formula 1 measured by an area of the X-ray photoelectron analysis spectrum may be about 1:1 to about 4:1, for example, about 1:1 to about 3:1, about 1:1 to about 2:1, about 1:1 to about 5:4, or about 1:1 to about 4:3.

The semiconductor nanocrystal particles may be a shape of a nanoplatelet. The nanoplatelet is a two-dimensional nanoparticle. In the present specification, the nanoplatelet or the two-dimensional nanoparticle refers to a particle having two lateral surfaces facing each other and a gap between lateral surfaces (hereinafter, thickness) of a nanosize (e.g., less than about 100 nm, for example, less than or equal to about 90 nm, less than or equal to about 80 nm, or less than or equal to about 70 nm). A maximum dimension (hereinafter, diameter) constituting the lateral surface in a nanoplatelet or two-dimensional nanoparticle may be about 5 times or more, about 6 times or more, about 7 times or more, about 8 times or more, about 9 times or more, or about 10 times or more and for example, about 2,000 times or less, about 1,000 times or less, about 500 times or less, about 300 times or less, about 100 times or less, about 90 times or less, about 80 times or less, about 70 times or less about 60 times or less, about 50 times or less, about 40 times or less, about 30 times or less, or about 20 times or less, of a thickness of the nanoplatelet or two-dimensional nanoparticle.

In an embodiment, the nanoplatelet may be a layered structure in which 1 to 5 monolayers, for example, 1 to 4 monolayer, 1 to 3 monolayer, or 1 to 2 monolayers are stacked, and the nanoplatelet may have a thickness of greater than or equal to 1 monolayer.

In an embodiment, the nanoplatelet may have a diameter of greater than or equal to about 10 nm, greater than or equal to about 15 nm, greater than or equal to about 20 nm, greater than or equal to about 25 nm, or greater than or equal to about 30 nm and less than or equal to about 60 nm, less than or equal to about 55 nm, less than or equal to about 50 nm, less than or equal to about 45 nm, or less than or equal to about 40 nm, for example, about 10 nm to about 60 nm, about 10 nm to about 55 nm, about 15 nm to about 55 nm, about 20 nm to about 50 nm, about 25 nm to about 50 nm, about 25 nm to about 45 nm, about 30 nm to about 45 nm, or about 30 nm to about 40 nm.

In an embodiment, the nanoplatelet may have a lateral surface area of greater than or equal to about 100 square nanometers ($nm^2$), for example, greater than or equal to about 150 $nm^2$, greater than or equal to about 200 $nm^2$, greater than or equal to about 250 $nm^2$, greater than or equal to about 300 $nm^2$, greater than or equal to about 350 $nm^2$, greater than or equal to about 400 $nm^2$, greater than or equal to about 450 $nm^2$, greater than or equal to about 500 $nm^2$, greater than or equal to about 600 $nm^2$, greater than or equal to about 650 $nm^2$, greater than or equal to about 700 $nm^2$, greater than or equal to about 750 $nm^2$, greater than or equal to about 800 $nm^2$, greater than or equal to about 850 $nm^2$, or greater than or equal to about 900 $nm^2$. In an embodiment, the nanoplatelet may have a lateral surface area of less than or equal to about 2,000 $nm^2$, for example, less than or equal to about 1,900 $nm^2$, less than or equal to about 1,800 $nm^2$, less than or equal to about 1,700 $nm^2$, less than or equal to about 1,600 $nm^2$, less than or equal to about 1,500 $nm^2$, less than or equal to about 1,400 $nm^2$, less than or equal to about 1,300 $nm^2$, less than or equal to about 1,200 $nm^2$, less than or equal to about 1,100 $nm^2$, or less than or equal to about 1,000 $nm^2$. In an embodiment, the nanoplatelet may have a lateral surface area of about 100 $nm^2$ to about 2,000 $nm^2$, about 150 $nm^2$ to about 2,000 $nm^2$, about 150 $nm^2$ to about 1,800 $nm^2$, about 150 $nm^2$ to about 1,600 $nm^2$, about 150 $nm^2$ to about 1,400 $nm^2$, about 150 $nm^2$ to about 1,400 $nm^2$, about 200 $nm^2$ to about 1,400 $nm^2$, about 250 $nm^2$ to about 1,400 $nm^2$, about 250 $nm^2$ to about 1,200 $nm^2$, or about 300 $nm^2$ to about 1,200 $nm^2$.

The lateral surface of nanoplatelet may have a predetermined two-dimensional shape, but is not particularly limited. The lateral surface may have two or more dimensions (e.g., length and width). The lateral surface of nanoplatelet may be polygon (triangle, quadrangle, parallelogram, rhombus, pentagon, hexagon, etc.). The lateral surface of nanoplatelet may be substantially not a circle. The lateral surface of nanoplatelet may have at least 2 sides facing each other. In an embodiment, the lateral surface of nanoplatelet may have a substantially rectangular shape.

Hereinafter, a method of producing the semiconductor nanocrystal particles is described with reference to FIG. 1. In an embodiment, oleic acid and oleylamine are exemplified as an organic ligand, toluene is exemplified as an antisolvent, RbI is exemplified as a first metal precursor, $SbI_3$ is exemplified as a second metal precursor, and $(C_3H_7)_2NH_2I$ is exemplified as an organic material precursor.

Referring to FIG. 1, a method of producing the semiconductor nanocrystal particles includes preparing an antisolvent including organic ligands, injecting a first metal precursor, a second metal precursor, and an organic material precursor into the antisolvent including the organic ligand to form a mixture, and heating the mixture at a relatively low temperature (e.g., a temperature of less than about 70° C.).

First, an antisolvent including an organic ligand is prepared.

The organic ligand may include $R^2COOH$, $R^2NH_2$, $R^2_2NH$, $R^2_3N$, $R^2SH$, $R^2_3PO$, $R^2_3P$, $R^2OH$, $R^2COOR^3$, $R^2_2PO(OH)_2$, $R^2_2POOH$, and $R^2COOCOR^3$ (wherein, $R^2$ and $R^3$ are independently a substituted or unsubstituted C1 to C24 aliphatic hydrocarbon group, or a substituted or unsubstituted C5 to C24 aromatic hydrocarbon group), or a combination thereof.

Specific examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, oleylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributyl phosphine, trioctyl phosphine, and the like; a phosphine compound, or an oxide compound thereof such as methyl phosphine oxide, ethyl phosphine oxide, propyl phosphine oxide, butyl phosphine oxide pentyl phosphine oxide, tributylphosphine oxide, octylphosphine oxide, dioctyl phosphineoxide, or trioctylphosphine oxide; diphenyl phosphine, a triphenyl phosphine compound, or an oxide compound thereof; a C5 to C20 alkyl phosphinic acid or a C5 to C20 alkyl phosphonic acid such as hexylphosphinic acid, octylphosphinic acid, dodecanephosphinic acid, tetradecanephosphinic acid, hexadecanephosphinic acid, octadecanephosphinic acid; and the like.

For example, the organic material derived from the organic ligand may be derived from an organic ligand including oleic acid, oleylamine, or a combination thereof.

The antisolvent may be a solvent that does not dissolve semiconductor nanocrystal particles, and the antisolvent may include a nitrogen-containing heterocyclic compound, a C6 or greater aromatic hydrocarbon group, an aromatic ether, or a combination thereof.

For example, the antisolvent may be a nitrogen-containing heterocyclic compound such as pyridine, a C6 or greater aromatic hydrocarbon group such as toluene, phenyldodecane, phenyltetradecane, phenyl hexadecane, a C12 to C22 aromatic ether such as phenyl ether, benzyl ether, or a combination thereof.

Next, the first metal precursor, the second metal precursor, and the organic material precursor are added to the antisolvent including the organic ligand to form a mixture.

The first metal precursor includes a precursor of a first metal including Rb, Cs, or a combination thereof, and optionally, the first metal precursor may further include a Na precursor, a K precursor, or a combination thereof.

For example, the first metal precursor may include a powder of the first metal, a C1 to C30 alkylated metal compound of the first metal, an alkoxide of the first metal, a carboxylate of the first metal, a nitrate of the first metal, a perchlorate of the first metal, a sulfate of the first metal, an acetylacetonate of the first metal, a halide of the first metal, a cyanide of the first metal, a hydroxide of the first metal, an oxide of the first metal, a peroxide of the first metal, or a combination thereof. For example, the halide of the first metal may be a Rb halide such as RbCl, RbI, or RbBr, a Cs halide such as CsCl, CsI, or CsBr, an Na halide such as NaCl, NaI, or NaBr, and a K halide such as KCl, KI or KBr, or a combination thereof.

The second metal precursor includes a precursor of a second metal including Sb, Bi, or a combination thereof, and optionally, the second metal precursor may further include a Cu precursor, a Sn precursor, an In precursor, a Ga precursor, a Zn precursor, an Ag precursor, an Au precursor, a Pd precursor, or a combination thereof.

For example, the second metal precursor may include a powder of the second metal, a C1 to C30 alkylated metal compound of the second metal, an alkoxide of the second metal, a carboxylate of the second metal, a nitrate of the second metal, a perchlorate of the second metal, a sulfate of the second metal, an acetylacetonate of the second metal, a halide of the second metal, a cyanide of the second metal, a hydroxide of the second metal, an oxide of the second metal, a peroxide of the second metal, or a combination thereof. For example, the halide of the second metal may include a Sb halide such as $SbCl_3$, $SbI_3$, $SbBr_3$, and the like, a Bi halide such as $BiCl_3$, $BiI_3$, $BiBr_3$, and the like, a Cu halide such as $CuCl_2$, $CuBr_2$, $CuI_2$, and the like, a Sn halide such as $SnCl_2$, $SnI_2$, $SnBr_2$, and the like, an In halide such as $InCl_3$, $InBr_3$, $InI_3$, and the like, a Ga halide such as $GaCl_3$, $GaBr_3$, $GaI_3$, and the like, a Zn halide such as $ZnCl_2$, $ZnBr_2$, $ZnI_2$, and the like, an Ag halide such as AgCl, AgBr, AgI, and the like, an Au halide such as $AuCl_3$, $AuBr_3$, $AuI_3$, and the like, a Pd halide such as $PdCl_2$, $PdBr_2$, $PdI_2$, and the like, or a combination thereof.

The organic material precursor is for improving stability in the synthesis reaction of semiconductor nanocrystal particle, and may include, for example, an ammonium salt.

The ammonium salt may be a salt including $NR^1_4{}^+$ (wherein $R^1$ is independently hydrogen, a hydroxyl group, a substituted or unsubstituted C1 to C24 linear or branched alkyl group, or a substituted or unsubstituted C7 to C30 arylalkyl group), $[CH(NH_2)_2]^+$, or a combination thereof. The counterion may be any suitable negative species, preferably an inorganic species such as a halide. For example, the ammonium salt may include ammonium chloride, ammonium bromide, ammonium iodide, formamidinium chloride, formamidinium bromide, formamidinium iodide, butylammonium chloride, butylammonium bromide, butylammonium iodide, diisopropylammonium chloride, diisopropylammonium bromide, diisopropylammonium iodide, methylammonium chloride, methylammonium bromide, methylammonium iodide, hydroxylammonium chloride, hydroxylammonium bromide, hydroxylammonium iodide, phenylethylammonium chloride, phenylethylammonium bromide, phenylethylammonium iodide, or a combination thereof.

The first metal precursor, the second metal precursor, and the organic material precursor may be added directly to an antisolvent including an organic ligand, but the present disclosure is not limited thereto. Alternatively, the first metal precursor and the second metal precursor, and the organic material precursor, respectively or together, may be dissolved in an organic solvent first to prepare a precursor mixture, and then the precursor mixture may be added to an antisolvent including an organic ligand.

Herein, the organic solvent may be a C6 to C22 primary amine such as hexadecylamine, oleylamine, and the like; a C6 to C22 secondary amine such as dioctylamine, and the like; a C6 to C40 tertiary amine such as trioctylamine, and the like; an amide such as N,N-dimethyl formamide, and the like; a nitrile such as acetonitrile, and the like; a nitrogen-containing heterocyclic compound such as pyridine, and the like; a C6 to C40 aliphatic hydrocarbon (e.g., alkane, alkene, alkyne, etc.) such as hexadecane, octadecane, octadecene, squalane, and the like; a C6 to C30 aromatic hydrocarbon such as phenyldodecane, phenyltetradecane, phenyl hexadecane; a phosphine substituted with a C6 to C22 alkyl group such as trioctyl phosphine, and the like; a phosphine oxide substituted with a C6 to C22 alkyl group such as trioctylphosphine oxide, and the like; a C12 to C22 aromatic ether such as phenyl ether or benzyl ether; or a combination thereof. The type and amount of the organic solvent may be appropriately selected taking into consideration the types of the precursors.

In addition, the amount ratio among the organic ligand, the first metal precursor, the second metal precursor, and the organic material precursor may be appropriately selected according to chemical formula of the semiconductor nanocrystal particle to be prepared, and the mole ratio of materials of the A position, A' position, D position, and E position of Chemical Formula 1 has been described above.

Next, the mixture is heated at a temperature of less than about 70° C. to perform a reaction among the organic ligand, the first metal precursor, the second metal precursor, and the organic material precursor. When performing the reaction, it may be confirmed that the reaction has taken place by a change of the color of the solution.

The reaction may be performed at a relatively low temperature, for example, less than about 70° C., for example, less than or equal to about 65° C., less than or equal to about 60° C., less than or equal to about 55° C., less than or equal to about 50° C., less than or equal to about 45° C., less than or equal to about 40° C., less than or equal to about 35° C., or less than or equal to about 30° C. and greater than about 0° C., for example, greater than or equal to about 5° C., greater than or equal to about 10° C., greater than or equal to about 15° C., greater than or equal to about 20° C., or greater than or equal to about 25° C., for example, greater than about 0° C. and less than about 70° C., or greater than about 0° C. and less than or equal to about 65° C., for example, room temperature (about 0° C. to about 30° C.) to about 60° C.

The reaction may be performed for less than or equal to about 5 seconds, less than or equal to about 4 seconds, less than or equal to about 3 seconds, about 0.5 seconds to 3 seconds, about 0.5 seconds to about 2 seconds, or about 1 second to about 2 seconds.

Subsequently, the product is centrifuged at a relatively low rate (e.g., about 1,000 revolutions per minute (rpm) to about 5,000 rpm), and then the unreacted products are removed to provide the semiconductor nanocrystal particles.

When the semiconductor nanocrystal particle is formed using a heat injection method, a different method from the method using the antisolvent may be used. For example, when using a heat injection method, a first metal precursor (e.g., Rb-oleate compound) is added into the solution in which the second metal precursor (e.g., $SbI_3$) and the organic ligand (e.g., oleic acid and oleylamine) are dissolved in a solvent and heated at greater than or equal to 70° C., for example, greater than or equal to about 80° C., or about 100° C. to about 150° C. for 1 second to 5 seconds to synthesize a semiconductor nanocrystal particle. The first metal precursor may be heated at a temperature of about 100° C. before adding the first metal precursor, and the first metal precursor may be prevented from precipitating from the reaction solution.

A semiconductor nanocrystal particle synthesized by a heat-injection method may have a low reaction stability as described above, and it may be difficult to control the growth to provide a desirable size, thickness, or combination thereof. The synthesized semiconductor nanocrystal particle may have a relatively large size, and a size deviation of synthesized semiconductor nanocrystal particles also may be relatively high.

Accordingly, a semiconductor nanocrystal particle synthesized using a heat injection method may have a relatively high emission line width (e.g., greater than about 30 nm), and a color coverage applicable in a visible light region by emitting light having a maximum emission peak in a wavelength region of greater than about 560 nm may be decreased because of the relatively large size of the semiconductor nanocrystal particle.

When the semiconductor nanocrystal particles are prepared using the antisolvent, the semiconductor nanocrystal particles may be synthesized at a lower temperature condition than the heat injection conditions, even at a room temperature. In addition, the synthesis is performed at the relatively low temperature condition, volatilization, oxidization, or a combination thereof of the second precursor may be reduced or eliminated, and reaction stability may be improved.

In addition, in the method of producing the semiconductor nanocrystal particles according to an embodiment, an organic ligand may be preliminarily injected under an antisolvent condition unlike the heat injection method, and perovskite crystal growth may be controlled by the organic ligand to provide semiconductor nanocrystal particles having a relative small and uniform size, although the semiconductor nanocrystal particles are synthesized by reacting the first metal precursor, the second metal precursor, and the organic material precursor which are later injected.

Accordingly, the semiconductor nanocrystal particles produced by the method of producing semiconductor nanocrystal particles according to an embodiment may exhibit a distribution of relatively small size and uniform size, may have a relatively narrow emission line width (e.g., less than or equal to about 30 nm), may emit light (blue to green light) having a maximum emission peak in a wavelength region of about 440 nm to about 560 nm (expressed by maximum emission peak) due to a relatively small size, and the color coverage implementable in visible light may be widened.

The semiconductor nanocrystal particles according to an embodiment may be utilized in various electronic devices. The electronic device may include a light emitting diode (LED), an organic light emitting diode (OLED), a sensor, a solar cell, an imaging sensor, or a liquid crystal display (LCD), but is not limited thereto.

EXAMPLES

Analysis Methods
1. Analysis of Powder X-ray Diffraction (XRD)

Semiconductor nanocrystal particles are drop-casted on a glass slide. Subsequently, an X-ray diffraction analysis of the semiconductor nanocrystal particles is performed using a D/teX Ultra silicon strip detector and a Rigaku MiniFlex-6G 600 device (Bragg-Brentano geometry) mounted with a Cu-Kα radiation source (λ=1.5406 angstroms (Å)) operating at 40 kilovolts (kV) and 15 milliamperes (mA).

2. X-ray Photoelectron Spectroscopy (XPS)

Semiconductor nanocrystal particles are drop-casted on a glass slide. Subsequently, X-ray photoelectron spectroscopy is performed using a Thermo Scientific K-Alpha XPS system. For example, a presence of the predetermined atom is specified by detecting photoelectron within the predetermined energy range using an Al-Kα source having a spot size of 400 micrometers (μm).

3. Transmission Electron Microscopy (TEM) Analysis

One time-washed semiconductor nanocrystal particles are centrifuged at 13,000 revolutions per minute (rpm) for 10 minutes. Subsequently, the precipitates are collected and re-dispersed in toluene to carry out an ultrasonication. Subsequently, the ultrasonicated semiconductor nanocrystal particles are drop-casted on a carbon film-coated TEM grid. Subsequently, a high resolution TEM imaging is performed at a 300 kV using a Hitachi HF 3300 microscope. The obtained TEM images are treated/analyzed by a Gatan digital microscope software.

4. Optical Property Analysis-1

The photo absorption spectrum of semiconductor nanocrystal particles is measured by Perkin Elmer 950 UV/VIS/NIR spectrophotometer mounted with an integrating sphere for measuring a thin film. Photoluminescence (PL) spectra and PL-decay measurements are performed using a Horiba FluoroLog-3 spectrofluorometer having a reflection geometric structure under the ambient condition.

For example, after excitation of the semiconductor nanocrystal particles using monochromatic light (375 nanometers (nm)) from a Xenon lamp, the emitted light is passed through 500 nm blazed lattice monochromer (iHR320) to be collected by an infrared photomultiplier tube. Rich-PL measurement is performed by exciting semiconductor nanocrystal particles using a 374 nm diode laser at a repeating rate of 10 megahertz (MHz).

5. Optical Property Analysis-II

Color coordinates (Cx, Cy) of light emitted from the semiconductor nanocrystal particles are measured by a spectroradiometer (Konica Minolta, CS-2000).

Example 1

0.6 millimoles (mmol) of RbI, 0.6 mmol of $(C_3H_7)_2NH_2I$, and 0.8 mmol of $SbI_3$ are dissolved in 9.5 milliliters (mL) of acetonitrile and 0.5 mL of N,N-dimethyl formamide to provide a solution of organic material precursors/metal precursors. Subsequently, the solution of organic material precursors/metal precursors is stirred at a room temperature (about 10° C. to 30° C.) for 2 hours to completely dissolve the organic material precursor/metal precursor. Then organic material precursor/metal precursor which has been not dissolved is removed through a filtering process.

500 microliters (μL) of oleic acid and 70 μL of oleylamine are added into 10 mL of toluene to provide an antisolvent solution including organic ligand.

Subsequently, 1.0 mL of the filtered organic material precursor/metal precursor solution is added into the antisolvent solution which is being vigorously stirred to carry out a reaction for forming nanoplatelet. The reaction is performed for 1 second to 5 seconds, for example, 1 second to 3 seconds. Then the product is further stirred for 1 minute and then centrifuged at 5,000 rpm for 5 minutes, and the unreacted residue is removed to provide nanoplatelet of Example 1.

Example 2

A nanoplatelet of Example 2 is prepared in accordance with the same procedure as in Example 1, except that 0.6 mmol of $C_4H_{12}IN$ is added instead of 0.6 mmol of $(C_3H_7)_2NH_2I$ to provide a solution of organic material precursor/metal precursor.

Comparative Example 1

1.63 grams (g) of RbI and 2.3 g of $SbI_3$ are dissolved in 2 mL of hydrogen iodide (HI) to provide a solution, and the solution is heated at about 100° C. for 24 hours to dissolve a precursor. Then the precursor-dissolved solution is cooled to about 20° C. at a rate of 0.014 K (Kelvin)/minute to provide a bulk perovskite single crystal (width×height× thickness: 5 millimeters (mm)×5 mm×5 mm). Then the obtained bulk perovskite single crystal is washed with isopropyl alcohol to provide a bulk perovskite single crystal of Comparative Example 1.

Comparative Example 2

A nanoplatelet of Comparative Example 2 is prepared in accordance with the same procedure as in Example 2, except that the reaction of forming the nanoplatelet is preformed at 70° C. instead of the room temperature.

Comparative Example 3

A nanoplatelet of Comparative Example 3 is prepared in accordance with the same procedure as in Example 1, except that the solution of organic material precursor/metal precursor is prepared without adding 0.6 mmol of RbI.

Comparative Example 4

0.8 mmol of $SbI_3$, 500 μL of oleic acid, and 70 μL of oleylamine are dissolved in 9 mL of 1-octadecene to provide a first precursor solution.

0.6 mmol of Rb-oleate is dissolved in 1 mL of a solvent to provide a second precursor solution. Subsequently, the second precursor solution is heated at 100° C. Then the second precursor solution is added into the first precursor solution while the first precursor solution is heated at 150° C. to perform a reaction of forming nanoplatelet. The reaction is performed within 1 second. Then the product is further stirred for 1 minute and then centrifuged at 5,000 rpm for 5 minutes, and the unreacted residue is removed to provide a nanoplatelet of Comparative Example 4.

Evaluation 1: XRD Analysis of the Nanoplatelet of Example 1

An XRD analysis of the nanoplatelet of Example 1 is performed according to the analyzing method, and the results are shown in FIG. 2A, FIG. 2B, FIG. 2C, and FIG. 2D.

First, referring to FIG. 2A, FIG. 2B, FIG. 2C, and FIG. 2D, the nanoplatelet of Example 1 has peaks at 15.16°, 23.82°, 24.72°, and 25.98° which are respectively identified with a plane of (112), (214), (313), and (006), and it is confirmed to correspond to the simulation results of $Rb_3Sb_2I_9$.

Accordingly, the nanoplatelet of Example 1 has a mole ratio of (A position and A' position):(D position):(E position) of 3:2:9 in Chemical Formula 1, and it is confirmed to have a $A_3D_2E_9$ perovskite crystal structure, for example, a perovskite crystal structure corresponding to $Rb_3Sb_2I_9$.

Evaluation 2: XPS Analysis of the Nanoplatelet of Example 1

An XRD analysis of the nanoplatelet of Example 1 is performed according to the analysis method to find each amount of Rb, N, Sb, I on the nanoplatelet surface, and the results are shown in Table 1.

TABLE 1

| | Rb (mole percent (mol %)) | N (mol %) | Sb (mol %) | I (mol %) |
|---|---|---|---|---|
| Example 1 | 27 | 19 | 41 | 29 |

Referring to Table 1, it is confirmed that the nanoplatelet surface of Example 1 includes an excessive amount of Sb. In addition, it is confirmed that the nanoplatelet surface of Example 1 may satisfy a ratio of Rb and N of about 3:2.

Evaluation 3: TEM Analysis of the Nanoplatelet of Example 1

Figure 3:
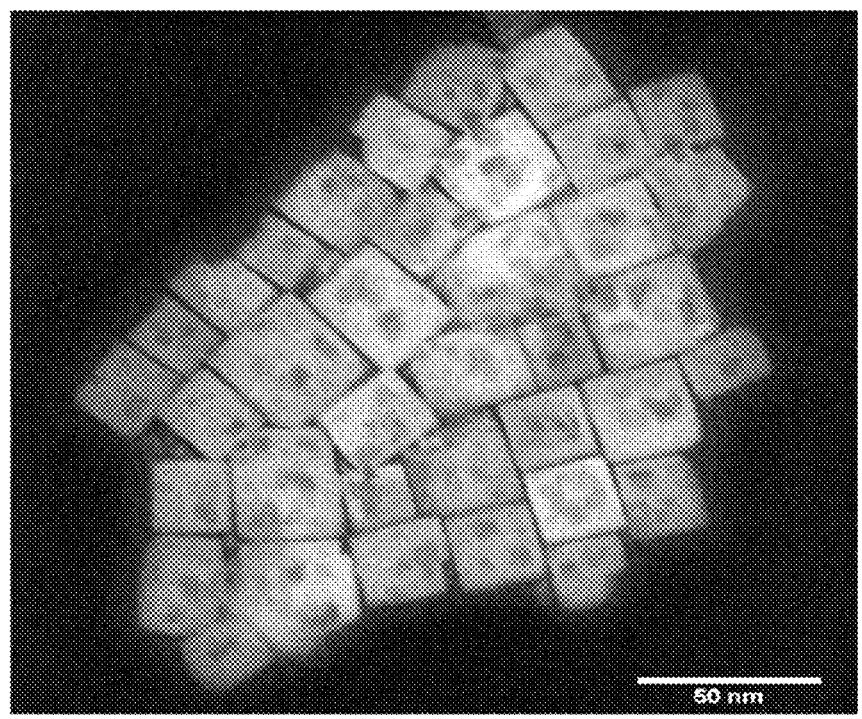
FIG. 3 is a surface-direction transmission electron microscopy (TEM) image of the nanoplatelet of Example 1.
Figure 4:
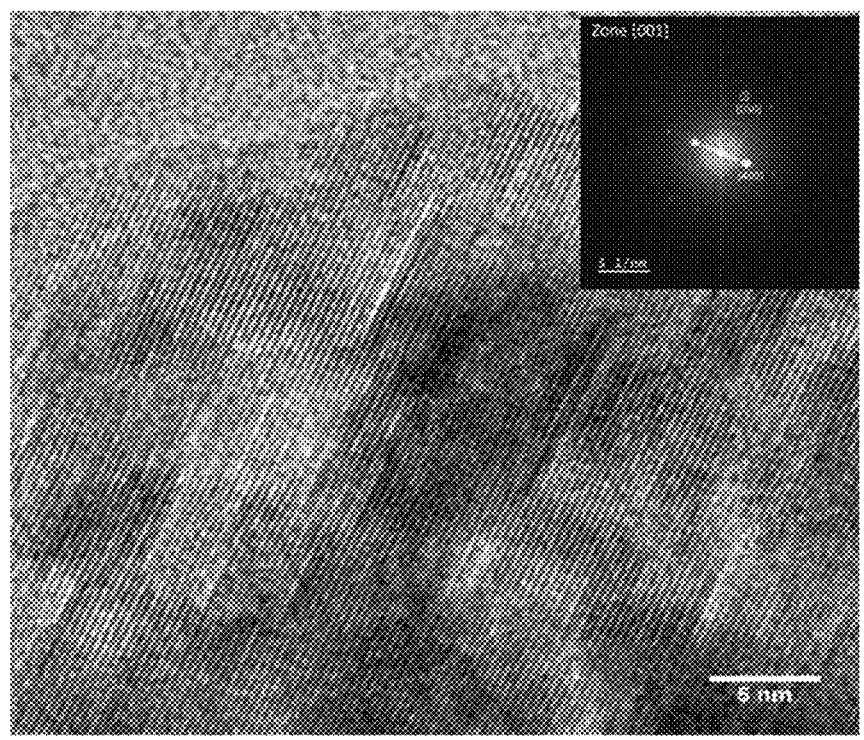
FIG. 4 is a thickness direction (lateral) TEM image of the nanoplatelet of Example 1.

A TEM analysis of the nanoplatelet of Example 1 is performed according to the method, and the results are shown in FIGS. 3 to 4.

Referring to FIG. 3, it is confirmed that the nanoplatelet of Example 1 is formed to have a lateral shape of substantial rectangle, which is according to a standard distribution that the lateral surface area is 550+173.9 square nanometers ($nm^2$), and the lateral average diameter is 34+5.2 nm.

In addition, referring to FIG. 4, it is confirmed that the nanoplatelet of Example 1 has a thickness of less than or equal to about 1 nm, for example, a thickness of 0.53 nm to 1 nm.

Evaluation 4: Optical Property Analysis of Nanoplatelets of Examples 1, 2 and Comparative Examples 2 to 4 and Bulk Perovskite Single Crystal of Comparative Example 1

Optical property analyses of the nanoplatelets of Examples 1, 2 and Comparative Examples 2 to 4 and bulk perovskite single crystal of Comparative Example 1 are performed according to the analysis method-I, and the results are shown in FIGS. 5 to 8.

Figure 5:
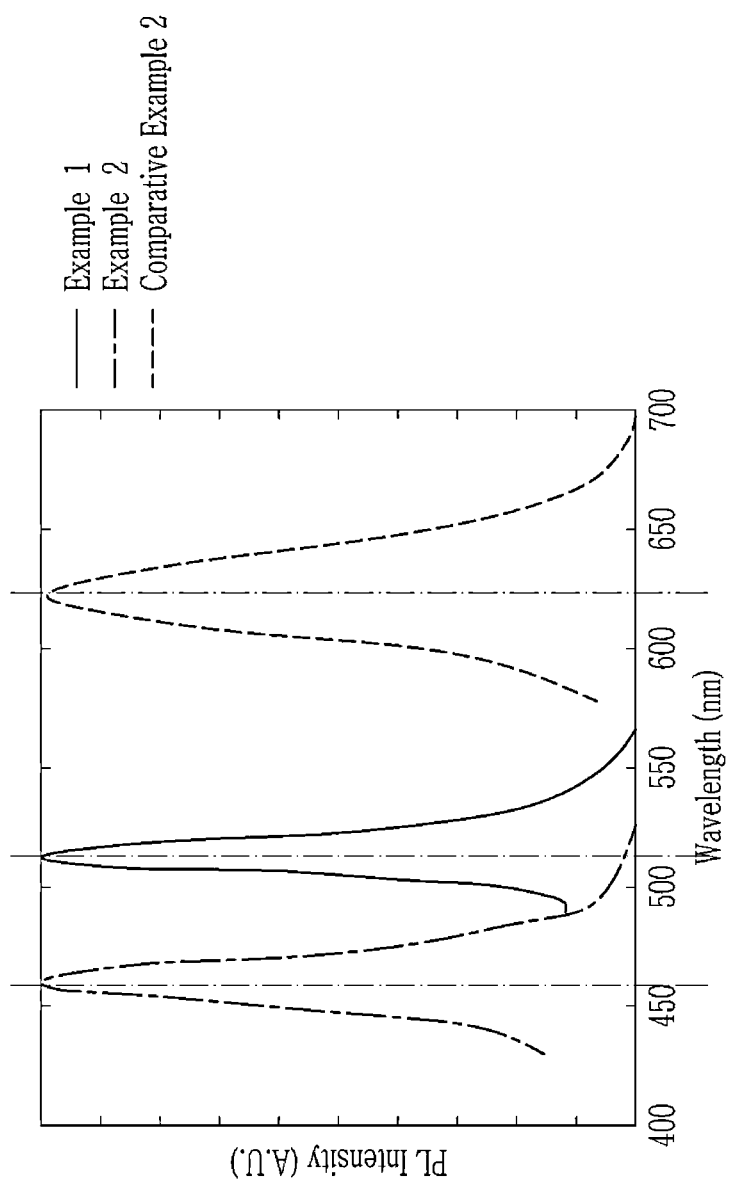
FIG. 5 is a graph of photoluminescence (PL) intensity (A.U.) versus wavelength (nm) showing the emission spectra of the nanoplatelets of Example 1, Example 2, and Comparative Example 2.
Figure 6:
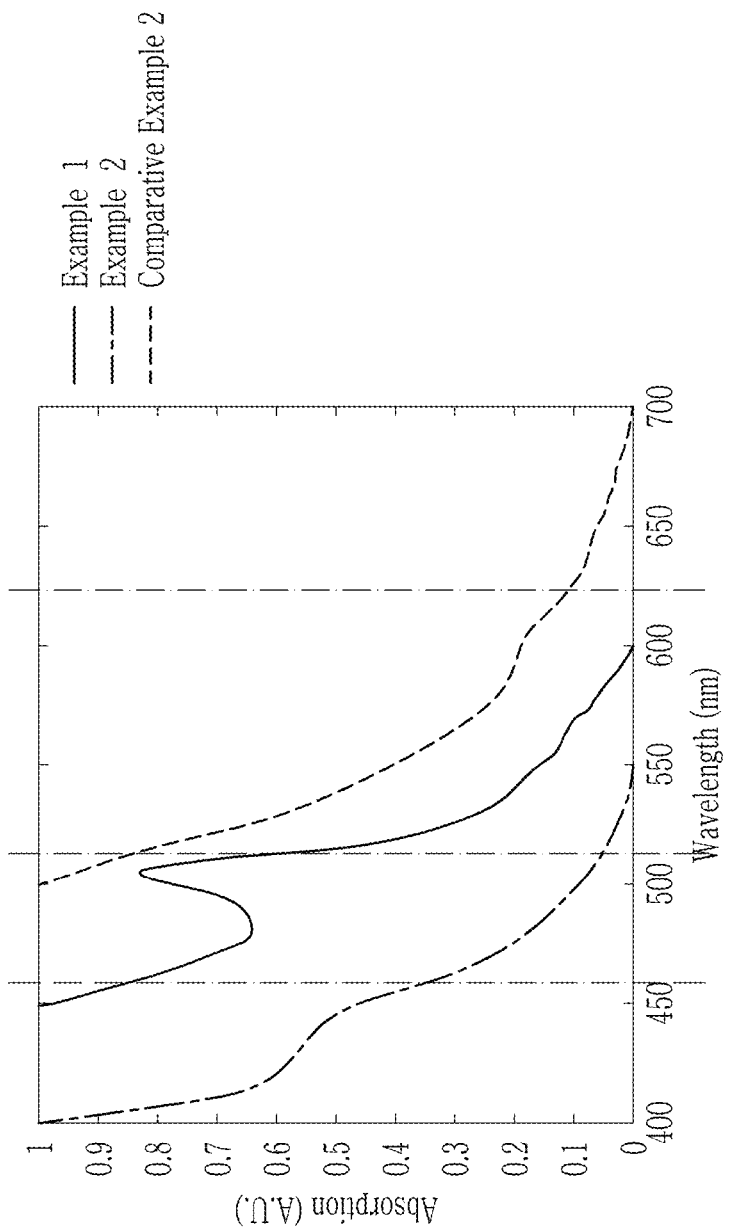
FIG. 6 is a graph of absorption (A.U.) versus wavelength (nm) showing the absorption spectra of the nanoplatelets of Example 1, Example 2, and Comparative Example 2.

First, referring to FIGS. 5 and 6, nanoplatelets of Examples 1 and 2 synthesized at a room temperature using an antisolvent method have a maximum emission peak ranging from 440 nm to 560 nm and satisfies a full width at half maximum (FWHM) of 30 nm (Example 1: maximum emission peak: 512 nm, full width at half maximum (FWHM): 21 nm; Example 2: maximum light emission peak: 462 nm, full width at half maximum (FWHM): 24 nm).

It is confirmed that the nanoplatelet of Comparative Example 2 emits red light having a maximum emission peak of 622 nm and a full width at half maximum (FWHM) of 34 nm. In other words, it is confirmed that the desirable nanoplatelet may be not obtained when it is synthesized at a relatively high temperature (70° C.) even if using the antisolvent method.

It is confirmed that the nanoplatelet of Comparative Example 3 including no Rb does not express photoluminescence properties. In other words, the nanoplatelet of Comparative Example 3 does not satisfy the aforementioned conditions of Chemical Formula 1, and may not function as a light emitting body.

Figure 7:
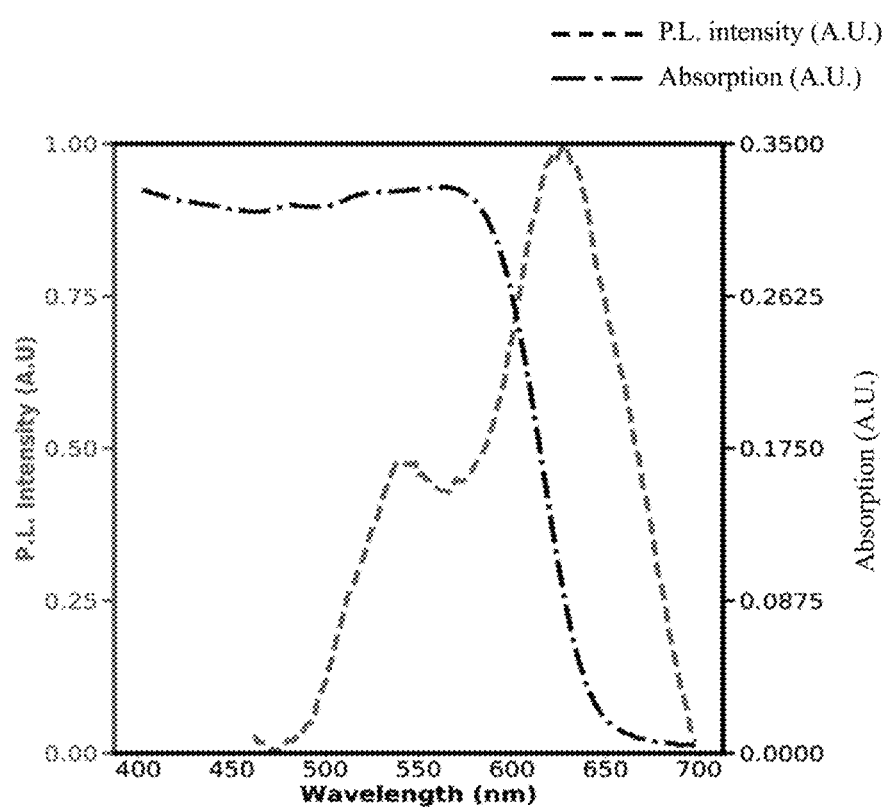
FIG. 7 is a graph of photoluminescence (P.L.) intensity (A.U.) and absorption (A.U.) versus wavelength (nm) showing emission and absorption spectra of a bulk perovskite single crystal of Comparative Example 1.

Referring to FIG. 7, it is confirmed that the bulk perovskite single crystal emits red light having a maximum emission peak of about 630 nm to 650 nm and a full width at half maximum (FWHM) of 40 nm to 50 nm.

Figure 8:
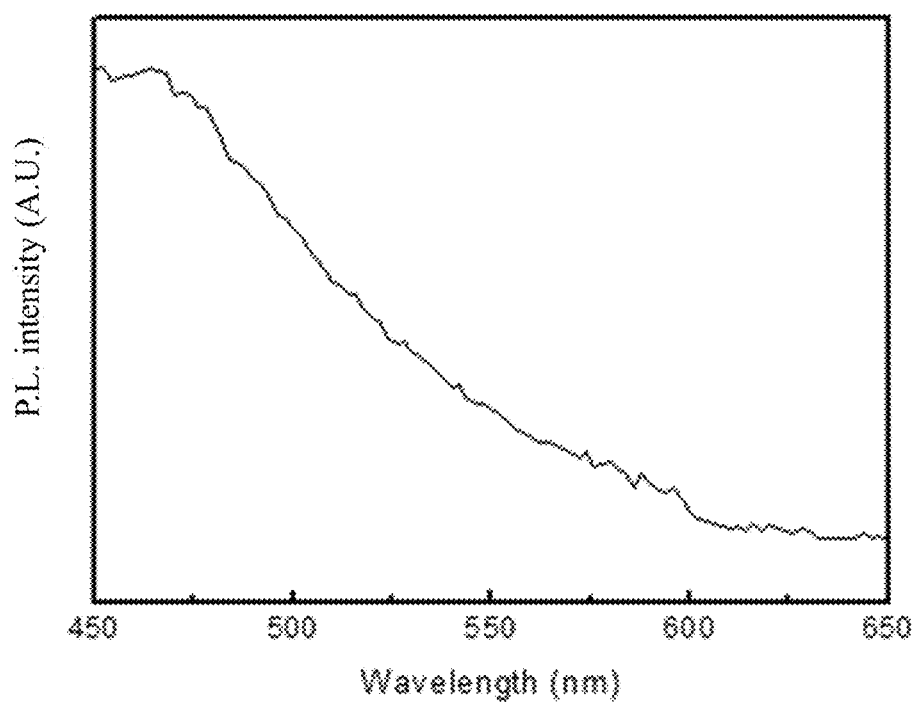
FIG. 8 is a graph of P.L. intensity (A.U.) and versus wavelength (nm) showing an emission spectrum of the nanoplatelet of Comparative Example 4.

Last, referring to FIG. 8, it is confirmed that the nanoplatelet of Comparative Example 4 obtained using the hot-injection method does not show clear maximum emission peak and full width at half maximum (FWHM). While not wishing to be bound by any theory, It is understood that the $SbI_3$ precursor may be oxidized, volatized, or a combination thereof at a high temperature and disappear, and the reaction is not appropriately carried out, e.g., completed.

Evaluation 5: Optical Property (Color Coordinate) Analysis of Example 1

Figure 9:
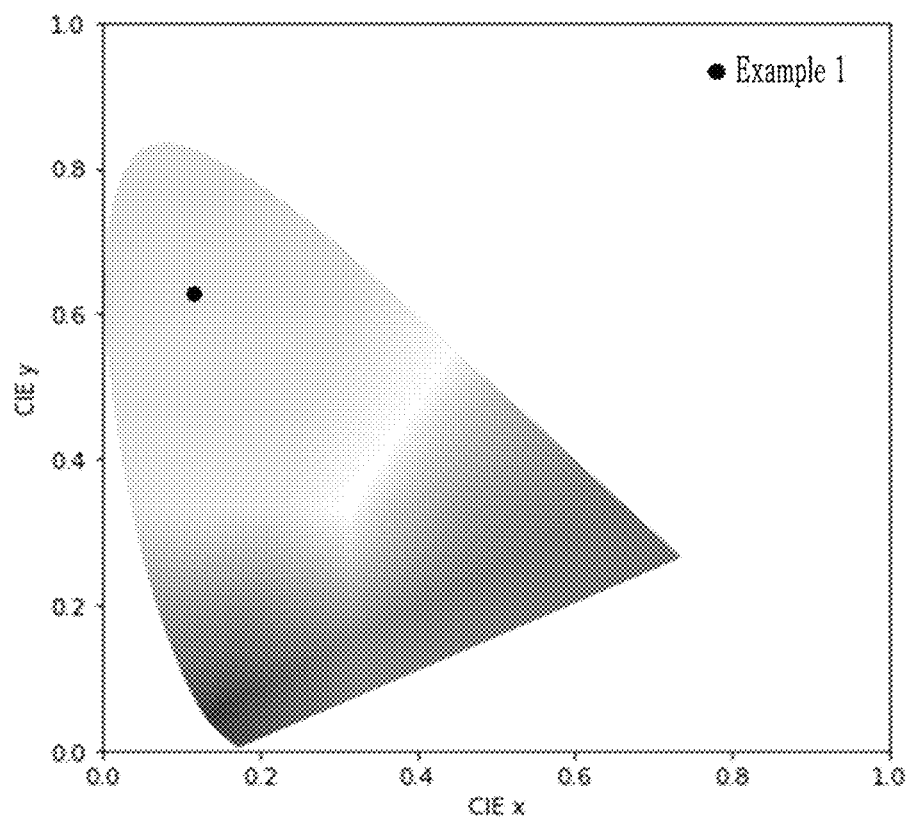
FIG. 9 shows the color coordinates (CIE x, CIE y) of the emitted light of the nanoplatelet of Example 1 in a CIE color space.
Figure 10:
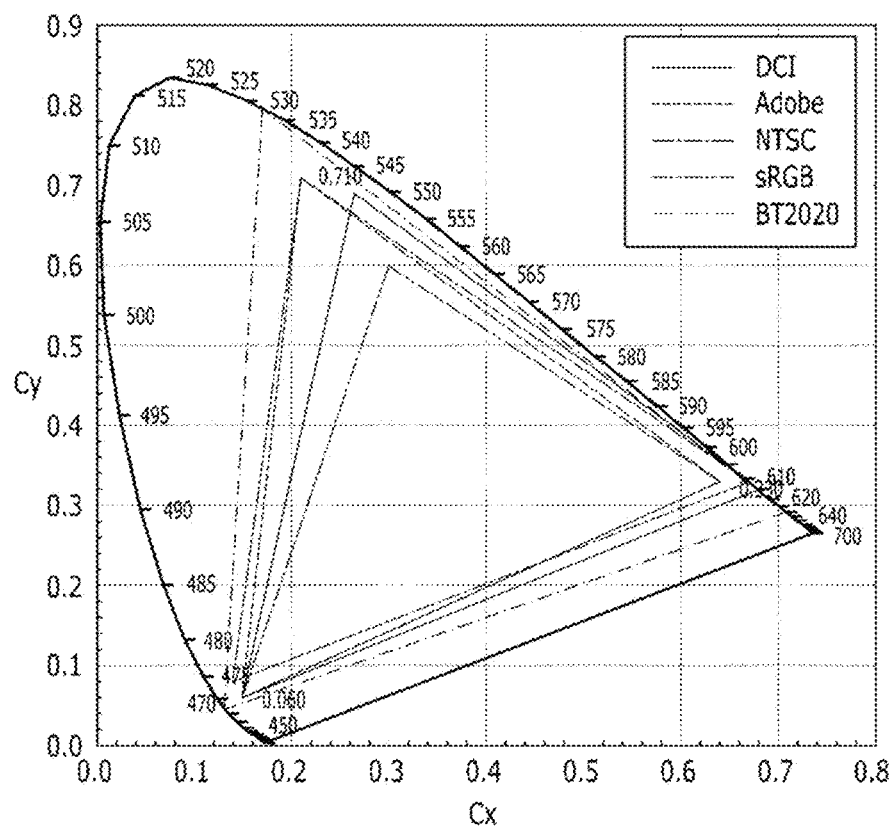
FIG. 10 shows color coordinates (Cx, Cy) of different color gamut range standards (DCI, Adobe, NTSC, sRGB, and BT2020) for color gamut evaluation in the CIE color space.

Optical property analyses of the nanoplatelet of Example 1 are performed according to the analysis method-II, and the results are shown in FIG. 9. FIG. 10 showing a variety of color gamut range standards for evaluating a color reproducibility in CIE1931 color space is also referred when analyzing FIG. 9.

Referring to FIGS. 9 and 10, it is confirmed that the nanoplatelet of Example 1 emits green light, the emitted light has a color coordinate Cx of less than 0.2 and Cy of greater than 0.6. The color coordinate (Cx, Cy) of the emitting light is within a BT2020 region which is the 4K UHD standard in CIE1931 color space. Accordingly, it is confirmed that an embodiment provides environmentally-friendly nanoplatelets having a high color purity.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A semiconductor nanocrystal particle represented by Chemical Formula 1:

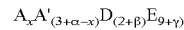   Chemical Formula 1

$A_xA'_{(3+\alpha-x)}D_{(2+\beta)}E_{9+\gamma}$ wherein, in Chemical Formula 1,
A is a first metal comprising Rb, Cs, or a combination thereof,
A' is an organic material derived from an ammonium salt, an organic material derived from an organic ligand, or an organic material comprising a combination thereof,
D is a second metal comprising Sb, Bi, or a combination thereof
E is Cl, Br, I, or a combination thereof,
$1<x\leq 3$,
$-1<\alpha<1$,
$3+\alpha-x>0$,
$-1<\beta<1$, and
$-1<\gamma<1$.

2. The semiconductor nanocrystal particle of claim 1, wherein the first metal further comprises Na, K, or a combination thereof.

3. The semiconductor nanocrystal particle of claim 1, wherein the second metal further comprises Cu, Sn, In, Ga, Zn, Ag, Au, Pd, or a combination thereof.

4. The semiconductor nanocrystal particle of claim 1, wherein the semiconductor nanocrystal particle has a maximum emission peak between about 440 nanometers and about 560 nanometers.

5. The semiconductor nanocrystal particle of claim 1, wherein the organic material derived from an ammonium salt comprises
$NR^1_4{}^+$, wherein $R^1$ is independently hydrogen, a hydroxyl group, a substituted or unsubstituted C1 to C24 linear or branched alkyl group, or a substituted or unsubstituted C7 to C30 arylalkyl group),
$[CH(NH_2)_2]^+$,
or a combination thereof.

6. The semiconductor nanocrystal particle of claim 5, wherein the organic material derived from an ammonium salt comprises formamidinium, butylammonium, diisopropylammonium, methylammonium, hydroxylammonium, phenylethylammonium, or a combination thereof.

7. The semiconductor nanocrystal particle of claim 1, wherein the semiconductor nanocrystal particle has a perovskite crystal structure.

8. The semiconductor nanocrystal particle of claim 1, wherein the semiconductor nanocrystal particle has a shape of a nanoplatelet.

9. The semiconductor nanocrystal particle of claim 1, wherein
the semiconductor nanocrystal particle emits green light having a maximum emission peak between about 500 nanometers and about 560 nanometers, and
the green light has a color coordinate Cx value of less than about 0.2 and a Cy value of greater than about 0.6.

10. The semiconductor nanocrystal particle of claim 1, wherein a molar amount of D of Chemical Formula 1, measured by an area of an X-ray photoelectron analysis spectrum on a surface of the semiconductor nanocrystal particle, is greater than a molar amount of each of the A, A', and E of Chemical Formula 1, measured by the area of the X-ray photoelectron analysis spectrum on the surface of the semiconductor nanocrystal particle.

11. The semiconductor nanocrystal particle of claim 1, wherein a mole ratio of A to A' of Chemical Formula 1, measured by an area ratio of the X-ray photoelectron analysis spectrum on the surface of the semiconductor nanocrystal particle, is about 1:1 to about 4:1.

12. A method of producing a semiconductor nanocrystal particle of claim 1, comprising
providing n antisolvent comprising an organic ligand,
injecting a first metal precursor, a second metal precursor, and an organic material precursor into the antisolvent comprising the organic ligand to form a mixture, and
heating the mixture at a temperature of less than about 70° C. to produce the semiconductor nanocrystal particle.

13. The method of claim 12, wherein the organic ligand comprises $R^2COOH$, $R^2NH_2$, $R^2_2NH$, $R^2_3N$, $R^2SH$, $R^2_3PO$, $R^2_3P$, $R^2OH$, $R^2COOR^3$, $R^2PO(OH)_2$, $R^2_2POOH$, and $R^2COOCOR^3$, wherein, $R^2$ and $R^3$ are independently a substituted or unsubstituted $C_1$ to C24 aliphatic hydrocarbon group or a substituted or unsubstituted C5 to C24 aromatic hydrocarbon group, or a combination thereof.

14. The method of claim 13, wherein the organic ligand comprises oleic acid, oleylamine, or a combination thereof.

15. The method of claim 12, wherein the antisolvent comprises a nitrogen-containing heterocyclic compound, a C6 or greater aromatic hydrocarbon group, an aromatic ether, or a combination thereof.

16. The method of claim 12, wherein the first metal precursor comprises a powder of the first metal, an alkylated compound of the first metal, an alkoxide of the first metal, a carboxylate of the first metal, a nitrate of the first metal, a perchlorate of the first metal, a sulfate of the first metal, an acetylacetonate of the first metal, a halide of the first metal, a cyanide of the first metal, a hydroxide of the first metal, an oxide of the first metal, a peroxide of the first metal, or a combination thereof.

17. The method of claim 12, wherein the second metal precursor comprises a powder of the second metal, an alkylated compound of the second metal, an alkoxide of the second metal, a carboxylate of the second metal, a nitrate of the second metal, a perchlorate of the second metal, a sulfate of the second metal, an acetylacetonate of the second metal, a halide of the second metal, a cyanide of the second metal, a hydroxide of the second metal, an oxide of the second metal, a peroxide of the second metal, or a combination thereof.

18. The method of claim 12, wherein the organic material precursor comprises an ammonium salt.

19. An electronic device, comprising a semiconductor nanocrystal particle of claim 1.

* * * * *

UNITED STATES PATENT AND TRADEMARK OFFICE
CERTIFICATE OF CORRECTION

| | | |
|---|---|---|
| PATENT NO. | : 12,382,823 B2 | Page 1 of 1 |
| APPLICATION NO. | : 17/727940 | |
| DATED | : August 5, 2025 | |
| INVENTOR(S) | : Jihyun Min et al. | |

It is certified that error appears in the above-identified patent and that said Letters Patent is hereby corrected as shown below:

On the Title Page

Related U.S. Application Data, item (63):
Please delete "Continuation-in-Part of application No. 16/986,384, filed on Aug. 6, 2020, now Pat. No. 11,312,904."
And replace with -- Continuation of application No. 16/986,384, filed on Aug. 6, 2020, now Pat. No. 11,312,904. --

In the Specification

At Column 1, Line 8:
Please delete "This application is a continuation-in-part of U.S. appli-"
And replace with -- This application is a continuation of U.S. appli- --

Signed and Sealed this
Thirtieth Day of December, 2025

John A. Squires
*Director of the United States Patent and Trademark Office*